United States Patent
Ito

(10) Patent No.: US 6,469,651 B1
(45) Date of Patent: Oct. 22, 2002

(54) MULTI-FUNCTION TYPE ABSOLUTE CONVERTER

(75) Inventor: Yoshinori Ito, Nagano-ken (JP)

(73) Assignee: Harmonic Drive Systems, Inc., Tokyo (JP)

(*) Notice: Subject to any disclaimer, the term of this patent is extended or adjusted under 35 U.S.C. 154(b) by 0 days.

(21) Appl. No.: 09/977,393

(22) Filed: Oct. 16, 2001

(51) Int. Cl.[7] ............................... H03M 5/22
(52) U.S. Cl. ........................... 341/160; 341/116
(58) Field of Search ........................ 341/160, 116, 341/118, 112, 155

(56) References Cited

U.S. PATENT DOCUMENTS 5,066,953 A * 11/1991 Lengenfelder .............. 341/155
5,933,106 A * 8/1999 He ............................. 341/155

* cited by examiner

*Primary Examiner*—Brian Young
(74) *Attorney, Agent, or Firm*—Burns, Doane, Swecker & Mathis, L.L.P.

(57) ABSTRACT

A multi-function type absolute converter comprises a sensor I/O port having a plurality of sensor connection terminals that can be connected to a plurality of absolute sensors, a conversion circuit for converting absolute sensor detection signals input via the sensor connection terminals to digital position signals, a PLD that can perform prescribed processing on the digital position signals thus generated, a host I/O port having output terminals for outputting the digital position signals and signals generated by the programmable logic device, a switching circuit for switching sensor connection terminals, and a control circuit for controlling each part, the control circuit comprising mainly a CPU, ROM and RAM. The inclusion of a PLD enables the multi-function type absolute converter to be flexibly adapted to user specification.

2 Claims, 1 Drawing Sheet

MULTI-FUNCTION TYPE ABSOLUTE CONVERTER

BACKGROUND OF THE INVENTION

1. Field of the Invention

The present invention relates to a multi-function type absolute converter that can be adapted to a user-specification based interface.

2. Description of the Prior Art

An absolute converter having a preset specification incorporates a conversion circuit for converting absolute sensor detection signals to digital position signals, and is configured to output digital signals having a specific, predetermined pattern. Therefore, each time there is a change in the required signal specification, it is necessary to make changes to the circuitry of the absolute converter. Moreover, in order to write information to, and erase information in, system ROM in which are stored signal conversion lookup tables and conversion control programs and the like, it is necessary to remove the ROM or to make up separate write circuit patterns.

An object of the present invention is to provide a multi-function type absolute converter that can readily convert output signal patterns and the like.

SUMMARY OF THE INVENTION

A multi-function type absolute converter according to the present invention comprises a sensor I/O port having a plurality of sensor connection terminals that can be connected to a plurality of absolute sensors, a conversion circuit for converting absolute sensor detection signals input via the sensor connection terminals to digital position signals, a programmable logic device that can perform prescribed processing on the digital position signals thus generated, a host I/O port having output terminals for outputting the digital position signals and signals generated by the programmable logic device, a switching circuit for switching sensor connection terminals, and a control circuit for controlling each part, the control circuit comprising mainly a CPU, ROM and RAM.

Switching by the switching circuit can be controlled by switching control signals from the control circuit or switching control signals input via the host I/O port.

Further features of the invention, its nature and various advantages will be more apparent from the accompanying drawings and following detailed description of the invention.

DETAILED DESCRIPTION OF THE PREFERRED EMBODIMENT

Figure 1:
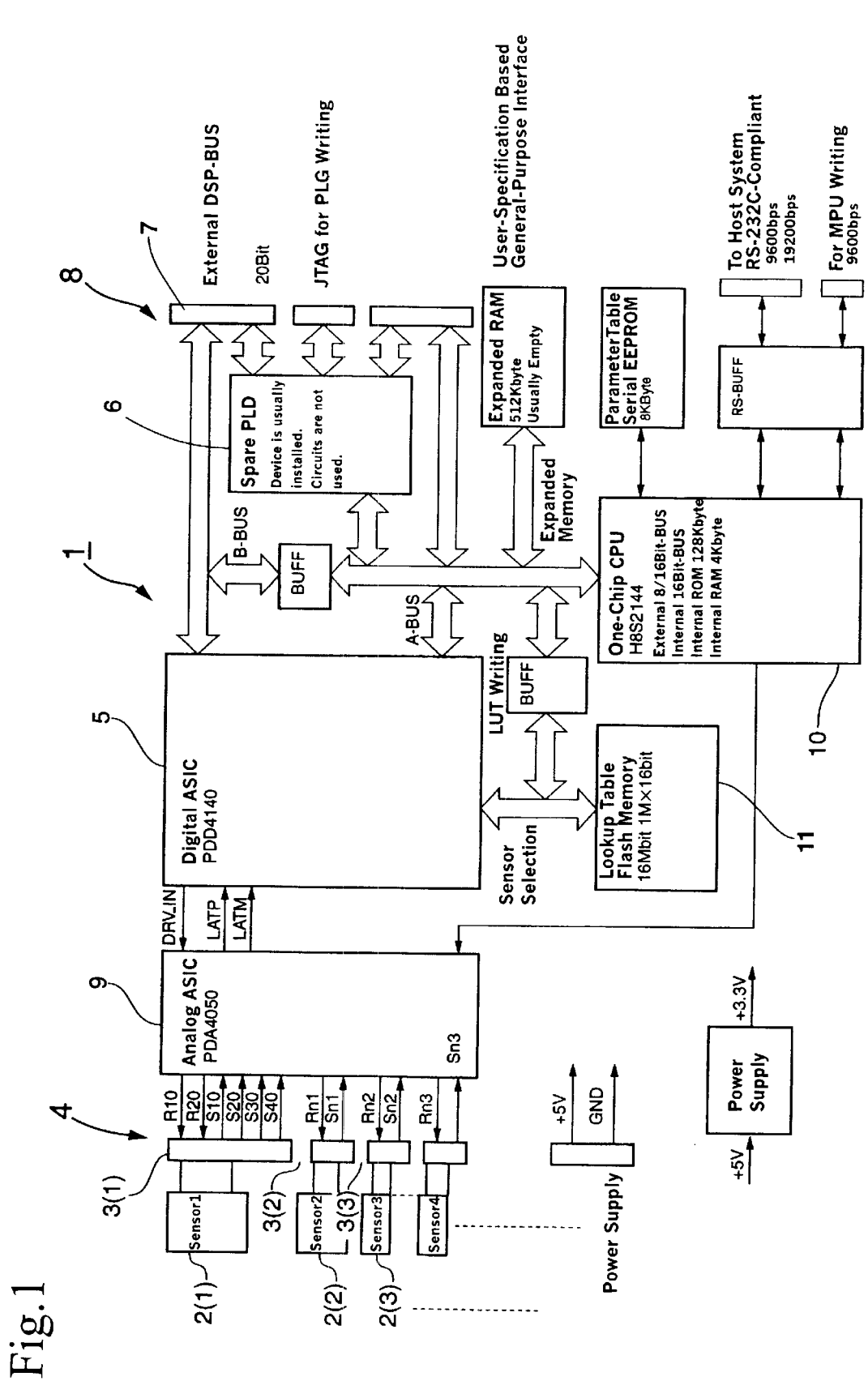
FIG. 1 is a block schematic diagram of an embodiment of the multi-function type absolute converter according to the present invention.

FIG. 1 is a block diagram of a multi-function type absolute converter that is an embodiment of the present invention. With reference to FIG. 1, a multi-function type absolute converter 1 comprises a sensor I/O port 4 that includes a plurality of sensor connection terminals 3(1), 3(2), 3(3) . . . that can be connected to a plurality of absolute sensors 2(1), 2(2), 2(3) . . . , a conversion circuit 5 for converting to digital position signals detection signals of the absolute sensors 2(1), 2(2), 2(3) . . . input via the sensor connection terminals 3(1), 3(2), 3(3) . . . , a programmable logic device (DLP) 6 that can perform prescribed processing on the digital position signals thus generated, a host I/O port 8 having output terminals 7 for outputting the digital position signals and signals generated by the PLD 6, a switching circuit 9 for switching the sensor connection terminals 3(1), 3(2), 3(3) . . . , and a control circuit 10 for controlling the parts 4, 5, 6 and 8, the control circuit 10 comprising mainly a CPU, ROM and RAM.

Switching by the switching circuit 9 is controlled by switching control signals from the control circuit 10 or switching control signals input via the host I/O port 8.

With this embodiment of the multi-function type absolute converter 1 thus configured, a plurality of absolute sensors 2(1), 2(2), 2(3) . . . can be connected, and by switching the switching circuit 9 in accordance with switching control signals from the control circuit 10 or a host system, detection signals of the absolute sensors 2(1), 2(2), 2(3) . . . can be used to detect the absolute position of a target detection object.

Since the system incorporates the PLD 6, the PLD 6 can be reprogrammed and functions can also be added or changed by modifying the control program stored in the ROM of the control circuit 10. For example, it is possible to effect absolute position detection while processing various types of data. Examples of types of data processing include data stabilization by the moving average method, and self-calibration of detection signals by the time-scaling method by rotating the detection object at a uniform speed.

It is also possible to output high bit-count data by expanding the pitch counter in the PLD 6. The incorporation of the PLD 6 also enables a high degree of adaptability to user specifications, by connecting directly to users' expansion buses, connecting to FA LANs, and matching users' serial transfer formats.

If the multi-function type absolute converter 1 is connected to a host computer, it becomes possible to use the host computer to remotely control the multi-function type absolute converter 1 and reference the memory of the converter 1. A USB connection can be used to effect high-speed writes to a flash ROM 11 that is connected to the conversion circuit 5 and in which conversion lookup tables are stored.

As described in the foregoing, the multi-function type absolute converter of this invention incorporates a PLD, which enables the system to be flexibly adapted to user specifications by reprogramming the PLD. It is also possible to switch detection axes to thereby selectively input detection signals from a plurality absolute sensors. The result is a multi-function type absolute converter having a high degree of general-purpose utility that can be used for positioning systems that employ multi-axial control of an object, based on detection signals from the plurality of absolute sensors.

What is claimed is:

1. A multi-function type absolute converter comprising:
   a sensor I/O port having a plurality of sensor connection terminals that can be connected to a plurality of absolute sensors;
   a conversion circuit for converting absolute sensor detection signals input via the sensor connection terminals to digital position signals;
   a programmable logic device that can perform prescribed processing on the digital position signals thus generated;

a host I/O port having output terminals for outputting the digital position signals and signals generated by the programmable logic device;

a switching circuit for switching sensor connection terminals; and a control circuit for controlling each part, the control circuit comprising mainly a CPU, ROM and RAM.

2. A multi-function type absolute converter according to claim 1, wherein switching by the switching circuit is controlled by switching control signals from the control circuit or switching control signals input via the host I/O port.

* * * * *